US006661384B2

(12) United States Patent
Mizuno

(10) Patent No.: US 6,661,384 B2
(45) Date of Patent: Dec. 9, 2003

(54) MIRROR SURFACE ACCURACY MEASURING DEVICE AND MIRROR SURFACE CONTROL SYSTEM OF REFLECTOR ANTENNA

(75) Inventor: Tomohiro Mizuno, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/167,417

(22) Filed: Jun. 13, 2002

(65) Prior Publication Data

US 2003/0112201 A1 Jun. 19, 2003

(30) Foreign Application Priority Data

Dec. 17, 2001 (JP) ....................................... 2001-383293

(51) Int. Cl.[7] ................................................ G01R 29/10
(52) U.S. Cl. .................... 343/703; 342/360; 343/781 R
(58) Field of Search ............................ 343/703, 781 R, 343/840; 342/360; 33/228

(56) References Cited

U.S. PATENT DOCUMENTS 3,940,858 A * 3/1976 Perotti et al. ................. 33/228
5,119,105 A * 6/1992 Ngai et al. .................. 343/703
5,374,934 A * 12/1994 Miura et al. ................ 343/703
6,288,683 B1 9/2001 Deguchi et al. ............ 343/703

FOREIGN PATENT DOCUMENTS

| | | | |
|---|---|---|---|
| JP | 4-271604 | 9/1992 | .......... H01Q/19/12 |
| JP | 2000-201019 | 7/2000 | ......... H01Q/19/185 |
| WO | WO 00/13261 | 3/2000 | .......... H01Q/19/18 |

OTHER PUBLICATIONS

M. Ishiguro, et al., "Measurement of Mirror Surface Accuracy of 45m Radio Telescope Based on Radio Holography Method" Technical Report vol. 62, No. 5, 1988, pp. 69–74. (With Partial English Translation).

* cited by examiner

*Primary Examiner*—Hoang Nguyen
(74) *Attorney, Agent, or Firm*—Oblon, Spivak, McClelland, Maier & Neustadt, P.C.

(57) ABSTRACT

Radiation field distributions of all mirror panels composing a main reflector are measured and held in advance, radiation field distributions of a reflector antenna having the main reflector are measured by transmitting a radio wave from a collimation antenna arranged at a prescribed distance from the reflector antenna to the reflector antenna while changing an attitude of the reflector antenna, complex excitation coefficients of each mirror panel are calculated from the radiation field distributions of the mirror panels, the radiation field distributions of the reflector antenna and the attitudes of the reflector antenna, and mirror surface accuracy of the main reflector is calculated from the complex excitation coefficients of the mirror panels.

12 Claims, 7 Drawing Sheets

MIRROR SURFACE ACCURACY MEASURING DEVICE AND MIRROR SURFACE CONTROL SYSTEM OF REFLECTOR ANTENNA

BACKGROUND OF THE INVENTION

1. Field of the Invention

The present invention relates to a mirror surface accuracy measuring device which is applied to a reflector antenna such as a large diameter radio telescope for astronomic observation using a millimeter radio wave or a submillimeter radio wave and in which mirror surface accuracy of the reflector antenna is measured. Also, the present invention relates to a mirror surface control system of the reflector antenna in which the adjustment of a mirror surface of a main reflector composed of a plurality of mirror panels is improved according to the mirror surface accuracy measured by the mirror surface accuracy measuring device.

2. Description of Related Art

A reflector antenna such as a radio telescope is used to perform astronomic observation by reflecting a radio wave radiated from a faraway celestial body on a reflector, converging the reflected radio wave and receiving the converged radio wave in a primary radiator. A radio wave radiated from a celestial body is propagated while spreading like a spherical wave. However, because an observation point is far away from the celestial body, the radio wave of the celestial body is incident like a plane wave on the reflector antenna. In case of the astronomic observation using the radio telescope, to efficiently converge the radio wave incident like a plane wave on the primary radiator, a uniform aperture phase distribution is required. This aperture phase distribution directly depends on the mirror surface accuracy of the main reflector. Therefore, it is very important to heighten the mirror surface accuracy of the reflector antenna for the purpose of improving the observation performance of the reflector antenna.

To measure the mirror surface accuracy of the reflector antenna, a mechanical measuring technique using a private gauge or a range-angle measuring unit and an electrical measuring technique such as a radio holography method have been used as a prior art. In cases where the mechanical measuring technique is used to measure the mirror surface accuracy of the reflector antenna, because a measurement error in the use of a measurement jig depends on the manufacturing accuracy and positioning accuracy of the measurement jig, it is difficult to significantly measure the mirror surface accuracy required of the reflector antenna such as a large diameter radio telescope which is used to perform astronomic observation with a millimeter radio wave or a submillimeter radio wave. Therefore, in a general case, the mechanical measuring technique is used for the initial adjustment of the mirror surface of the large diameter radio telescope used for the astronomic observation with a millimeter radio wave or a submillimeter radio wave, and the radio holography method of the electrical measuring technique is used for the final adjustment of the mirror surface.

FIG. 7 is a constitutional view showing the configuration of a conventional mirror surface control system in which mirror surface accuracy of a reflector antenna is measured and controlled according to a radio holography method. This conventional mirror surface control system is disclosed in “Measurement of Mirror Surface Accuracy of 45m Radio Wave Telescope based on Radio Holography Method”, written by M. Ishiguro, K. Morita, S. Hayashi, T. Masuda, E. Ebisu and S. Betsudan, Technical Report Vol. 62, No. 5, pp. 69–74 of Mitsubishi Electric Corporation, in 1988.

In FIG. 7, 1 indicates a reflector antenna. 2 indicates a geostationary satellite. 3 indicates a collimation antenna mounted on the geostationary satellite 2 and functioning as a transmitted wave source. 4 indicates a transmitted radio wave radiated from the collimation antenna 3. 5 indicates a main reflector of which the mirror surface accuracy is measured. 5*a* indicates each of a plurality of mirror panels composing the main reflector 5. 5*b* indicates each of a plurality of actuators for changing setting positions and attitudes of the mirror panels 5*a*. 5*c* indicates a backing structure on which the mirror panels 5*a* and the actuators 5*b* are supported. 6 indicates a primary radiator in which a radio wave reflected and converged on the main reflector 5 is received. 7 indicates a receiver to which the radio wave is fed from the primary radiator 6. 8 indicates each of a plurality of support struts. 9 indicates radiation field distribution data obtained in the receiver 7. 10 indicates an antenna attitude signal. An attitude of the reflector antenna 1 is changed according to the antenna attitude signal 10 to obtain the radiation field distribution data 9 corresponding to an attitude of the reflector antenna 1. 11 indicates a radio holography processor in which the Fourier transformation is performed to calculate an aperture distribution from the radiation field distribution data 9 and the antenna attitude signal 10. 12 indicates a mirror surface accuracy processor in which the mirror surface accuracy of the main reflector 5 is calculated from the aperture distribution obtained in the radio holography processor 11. 13 indicates a mirror surface control device which controls the actuators 5*b* according to the mirror surface accuracy obtained in the mirror surface accuracy processor 12 to adjust setting positions and attitudes of the mirror panels 5*a* of the main reflector 5. 14 indicates an actuator control signal. 15 indicates a reference antenna in which a reference of the radiation field distribution data 9 is measured.

Next, an operation of the conventional mirror surface control system will be described below.

To measure the mirror surface accuracy of the main reflector 5, a radio wave is used for the reflector antenna 1. Therefore, a transmission source position of the radio wave is placed sufficiently far away from the reflector antenna 1*a* in the same manner as the geostationary satellite 2. Also, in place of the geostationary satellite 2, in cases where a certain on-ground position sufficiently far away from the reflector antenna 1 is set as a transmission source position of the radio wave, the on-ground position is determined on condition that the reflection of the radio wave on the earth is reduced due to geographical features. A radiation field distribution of the transmitted wave 4 on the reflector antenna 1 is obtained by receiving the transmitted wave 4 while changing the attitude of the reflector antenna 1 in two dimensions.

Therefore, the radiation field distribution data 9 and the antenna attitude signal 10 indicating the attitude of the reflector antenna 1 are measured in a pair. Because a relationship between the radiation field distribution and the aperture distribution of the transmitted wave 4 on the main reflector 5 is expressed by Fourier transformation, the radiation field distribution data 9 is sent to the radio holography processor 11, the calculation processing such as fast Fourier transformation is performed for the radiation field distribution data 9 and the antenna attitude signal 10, and the aperture distribution on the main reflector 5 is calculated. A phase term of the calculated aperture distribution expresses an aperture phase distribution and corresponds to the unevenness of the mirror surface of the main reflector 5. In the mirror surface accuracy processor 12, the aperture phase distribution is converted in used wavelength equivalent, and a distribution of degrees of deformation shifted from an ideal shape of the mirror surface is obtained. Therefore, the mirror surface accuracy of the main reflector 5 can be estimated. In addition, the setting positions and attitudes of the mirror panels 5*a* composing the main reflector 5 are corrected by the actuators 5*b* in the mirror surface control device 13, and the mirror surface accuracy of the main reflector 5 is improved.

In general, in view of antenna gain, it is required that the mirror surface accuracy of the main reflector 5 is equal to or lower than 1/20 of a wavelength of a radio wave (for example, a radio wave radiated from a celestial body) used for the astronomic observation. In case of the reflector antenna 1 having a large diameter, because the reflector antenna 1 is used for the astronomic observation in a frequency band of a millimeter wave or a submillimeter wave having a shorter wavelength, it is required to produce the main reflector 5 with high mirror surface accuracy. Therefore, to measure the mirror surface accuracy of the main reflector 5 with higher measuring accuracy, it is required to heighten the frequency of a radio wave used for the measurement of the mirror surface accuracy.

However, because the conventional mirror surface control system of the reflector antenna 1 has the above-described configuration, frequencies of radio waves possible to be radiated from the geostationary satellite 2 as the transmitted wave 4 for the measurement of the mirror surface accuracy of the main reflector 5 are limited to a certain frequency band. Therefore, a problem has arisen that the measuring accuracy for the mirror surface accuracy of the main reflector 5 cannot be sufficiently heightened.

Also, in cases where a transmitted wave source is disposed on the ground or in cases where a radio star is used as a transmitted wave source, the frequency of a radio wave used for the measurement of the mirror surface accuracy can be arbitrarily selected. However, in cases where the mirror surface accuracy of the main reflector 5 is measured by using a measuring radio wave such as a millimeter wave or a submillimeter wave of a frequency band corresponding to a short wavelength, the measuring radio wave is considerably attenuated during the propagation of the measuring radio wave. Therefore, it is difficult to sufficiently get a dynamic range for the measurement of the mirror surface accuracy, and a measuring angle range allowed for the significant measurement of the radiation field distribution is narrowed. In general, in cases where the aperture distribution is calculated from the radiation field distribution by using the Fourier transformation, a degree of resolution of the aperture distribution is almost inversely proportional to a measuring range of the radiation field distribution for paraxial rays. Therefore, in cases where a measuring angle range allowed for the significant measurement of the radiation field distribution is narrow, a problem has arisen that the resolution of the aperture distribution is insufficient. Also, because a millimeter wave or a submillimeter wave is used for the astronomic observation using a large diameter radio telescope, a size of each mirror panel is often reduced in view of mechanical manufacturing accuracy. In this case, it is important to obtain the aperture distribution at high resolution.

Also, in case of the radio holography method, it is required to measure the amplitude and phase of the radiation field distribution. However, in cases where a millimeter wave or a submillimeter wave of a very high frequency band is used, it is difficult to measure the phase of the radiation field distribution. Also, because it is required to prepare a two-dimensional map of the aperture distribution, it is required to measure the radiation field distribution in two dimensions. In this case, it takes a comparatively long time to measure the radiation field distribution in two dimensions, and the radiation field distribution is fundamentally measured in the outdoor environment. Therefore, a problem has arisen that the mirror surface accuracy of the main reflector 5 is changed during the measurement due to the influence of temperature or wind outdoors.

In contrast, in cases where the mirror surface accuracy of the main reflector 5 is measured at a very short distance, it is not required to measure the radiation field distribution corresponding to a long distance, but it is required to directly measure the aperture distribution on the main reflector 5 by using a probe. In this case, it is required to mechanically scan a plane surface, a cylindrical surface or a spherical surface of the main reflector 5 with the probe for the measurement of the mirror surface accuracy. However, because it is required to scan an area wider than that of the main reflector 5, in case of the large diameter radio telescope using a millimeter wave or a submillimeter wave, it is substantially very difficult to accurately scan a wide area. Therefore, a problem has arisen that the measuring accuracy depends on the scanning accuracy of the probe and is lowered.

SUMMARY OF THE INVENTION

An object of the present invention is to provide, with due consideration to the drawbacks of the conventional mirror surface control system of the reflector antenna, a mirror surface accuracy measuring device and a mirror surface control system of a reflector antenna in which a radio wave of a high frequency difficult to use in the prior art is usable, an aperture distribution is obtained at high resolution even in a case of a narrow angle range in effective measurement of a radiation field distribution, mirror surface accuracy based on the measurement of only amplitude of the radiation field distribution is estimated and the mirror surface accuracy of the reflector antenna is measured with high accuracy.

The object is achieved by the provision of a mirror surface accuracy measuring device of a reflector antenna, including a collimation antenna arranged at an interval of a prescribed distance from a reflector antenna, radiation field distribution measuring means for measuring a radiation field distribution of the reflector antenna for the prescribed distance while controlling an attitude of the reflector antenna, a mirror panel radiation field distribution holding device for holding a plurality of panel radiation field distributions of a plurality of mirror panels composing a main reflector of the reflector antenna as pre-measured data, complex excitation coefficient calculating means for calculating a complex excitation coefficient of each mirror panel of the main reflector according to the radiation field distribution of the reflector antenna, the panel radiation field distribution of the mirror panel and an antennal attitude signal which indicates the attitude of the reflector antenna controlled by the radiation field distribution measuring means, and mirror surface accuracy calculating means for calculating a mirror surface error of each mirror panel and mirror surface accuracy of the main reflector according to the complex excitation coefficients of the mirror panels of the main reflector.

Therefore, the complex excitation coefficients of the mirror panels can be obtained to express the radiation field distribution of the reflector antenna in a combination of the panel radiation field distributions of the mirror panels composing the main reflector, and the mirror surface errors of the mirror panels can be obtained. As a result, in cases where a radio wave such as a millimeter wave or a submillimeter wave of a frequency band corresponding to a very short wavelength is selected as a radio wave used for the measurement of the radiation field distribution of the reflector antenna, even though the observation area usable for the significant measurement of the radiation field distribution of the reflector antenna is small, a map of the mirror surface errors having degrees of resolution corresponding to sizes of the mirror panels can be obtained, and the measurement of the mirror surface accuracy of the main reflector can be performed with high accuracy.

Also, a plurality of observation points can be arbitrarily selected to measure the radiation field distribution of the reflector antenna, and it is only required that the number of observation points for the radiation field distribution of the reflector antenna is higher than the number of mirror panels composing the main reflector. Accordingly, a measuring time of the mirror surface accuracy of the main reflector can be comparatively shortened, and influence of temperature and wind in the measurement on the measured values can be reduce. Also, even though only the amplitude of the radiation field distribution of the reflector antenna is measured, the mirror surface accuracy of the main reflector can be estimated.

The object is also achieved by the provision of a mirror surface accuracy measuring device of a reflector antenna, including a collimation antenna arranged at an interval of a prescribed distance from a reflector antenna, radiation field distribution measuring means for measuring a radiation field distribution of the reflector antenna for the prescribed distance of the collimation antenna while controlling an attitude of the reflector antenna, a virtual mirror panel radiation field distribution calculating device for dividing a main reflector of the reflector antenna into a plurality of virtual mirror panels and calculating a panel radiation field distribution of each virtual mirror panel, complex excitation coefficient calculating means for calculating a complex excitation coefficient of each virtual mirror panel of the main reflector according to the radiation field distribution of the reflector antenna, the panel radiation field distribution of the virtual mirror panel and an antennal attitude signal which indicates the attitude of the reflector antenna controlled by the radiation field distribution measuring means, and mirror surface accuracy calculating means for calculating a mirror surface error of each virtual mirror panel and mirror surface accuracy of the main reflector according to the complex excitation coefficients of the virtual mirror panels of the main reflector.

Therefore, the complex excitation coefficients of the virtual mirror panels can be obtained to express the radiation field distribution of the reflector antenna in a combination of the panel radiation field distributions of the virtual mirror panels composing the main reflector, and the mirror surface errors of the virtual mirror panels can be obtained. As a result, even though an observation area usable for the measurement of the radiation field distribution of the reflector antenna is small, a map of the mirror surface errors having degrees of resolution corresponding to sizes of the virtual mirror panels can be obtained. In particular, because sizes of the virtual mirror panels can be arbitrarily determined, a map of the mirror surface errors can be obtained at high resolution.

Also, it is not necessarily required that the main reflector of the reflector antenna is composed of a plurality of mirror panels, and it is not required that the panel radiation fields of a plurality of mirror panel actually composing the main reflector are measured. Therefore, a total time required to measure the mirror surface accuracy of the main reflector can be shortened.

The object is also achieved by the provision of a mirror surface control system of a reflector antenna, including a collimation antenna arranged at an interval of a prescribed distance from a reflector antenna, radiation field distribution measuring means for measuring a radiation field distribution of the reflector antenna for the prescribed distance of the collimation antenna while controlling an attitude of the reflector antenna, a mirror panel radiation field distribution holding device for holding a plurality of panel radiation field distributions of a plurality of mirror panels composing a main reflector of the reflector antenna as pre-measured data, complex excitation coefficient calculating means for calculating a complex excitation coefficient of each mirror panel of the main reflector according to the radiation field distribution of the reflector antenna, the panel radiation field distribution of the mirror panel and an antennal attitude signal which indicates the attitude of the reflector antenna controlled by the radiation field distribution measuring means, mirror surface accuracy calculating means for calculating a mirror surface error of each mirror panel and mirror surface accuracy of the main reflector according to the complex excitation coefficients of the mirror panels of the main reflector, and mirror surface control means for controlling and correcting a plurality of setting positions of the mirror panels of the main reflector according to the mirror surface errors of the mirror panels.

Therefore, the complex excitation coefficients of the mirror panels are obtained to express the radiation field distribution of the reflector antenna in a combination of the panel radiation field distributions of the mirror panels composing the main reflector, a map of the mirror surface errors is obtained at degrees of resolution corresponding to sizes of the mirror panels, and a plurality of setting positions of the mirror panels are adjusted according to the map of the mirror surface errors. Accordingly, the main reflector can be obtained with high mirror surface accuracy.

The object is also achieved by the provision of a mirror surface control system of a reflector antenna, including a collimation antenna arranged at an interval of a prescribed distance from a reflector antenna, radiation field distribution measuring means for measuring a radiation field distribution of the reflector antenna for the prescribed distance of the collimation antenna while controlling an attitude of the reflector antenna, a virtual mirror panel radiation field distribution calculating device for dividing a main reflector of the reflector antenna into a plurality of virtual mirror panels and calculating a panel field distribution of each virtual mirror panel, complex excitation coefficient calculating means for calculating a complex excitation coefficient of each virtual mirror panel of the main reflector according to the radiation field distribution of the reflector antenna, the panel radiation field distribution of the virtual mirror panel and an antennal attitude signal which indicates the attitude of the reflector antenna controlled by the radiation field distribution measuring means, mirror surface accuracy calculating means for calculating a mirror surface error of each virtual mirror panel and mirror surface accuracy of the main reflector according to the complex excitation coefficients of the virtual mirror panels of the main reflector, and mirror surface control means for controlling and correcting a plurality of setting positions of a plurality of mirror panels of the main reflector according to the mirror surface errors of the virtual mirror panels.

Therefore, the complex excitation coefficients of the virtual mirror panels are obtained to express the radiation field distribution of the reflector antenna in a combination of the panel radiation field distributions of the virtual mirror panels virtually composing the main reflector, a map of the mirror surface errors is obtained at degrees of resolution corresponding to sizes of the virtual mirror panels, and a plurality of setting positions of the mirror panels of the main reflector are adjusted according to the map of the mirror surface errors of the virtual mirror panels. Accordingly, the main reflector can be obtained with high mirror surface accuracy.

DETAILED DESCRIPTION OF THE PREFERRED EMBODIMENTS

Embodiments of the present invention will now be described with reference to the accompanying drawings.

Embodiment 1

Figure 1:
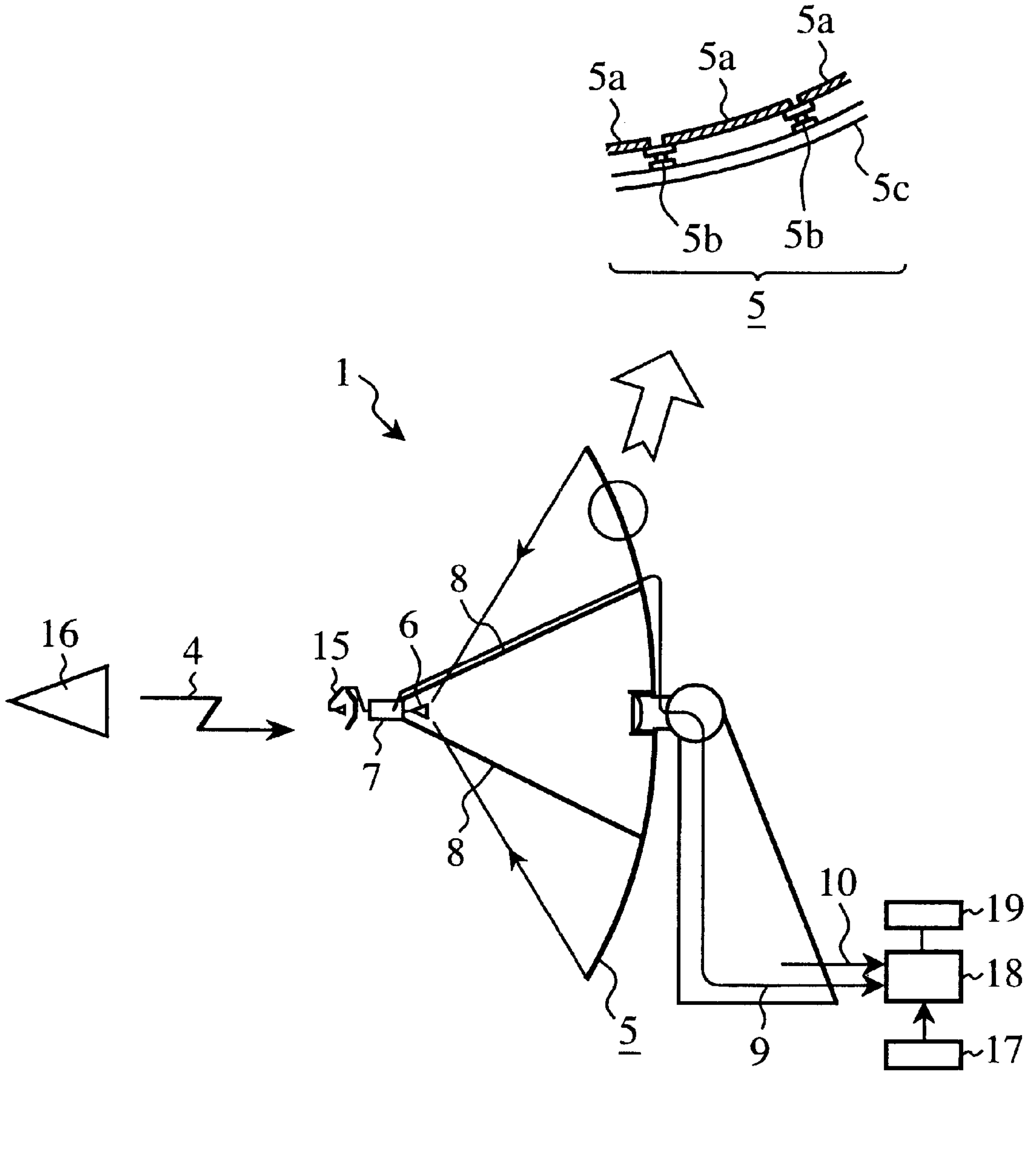
FIG. 1 is a mirror surface accuracy measuring device of a reflector antenna according to a first embodiment of the present invention.
Figure 7:
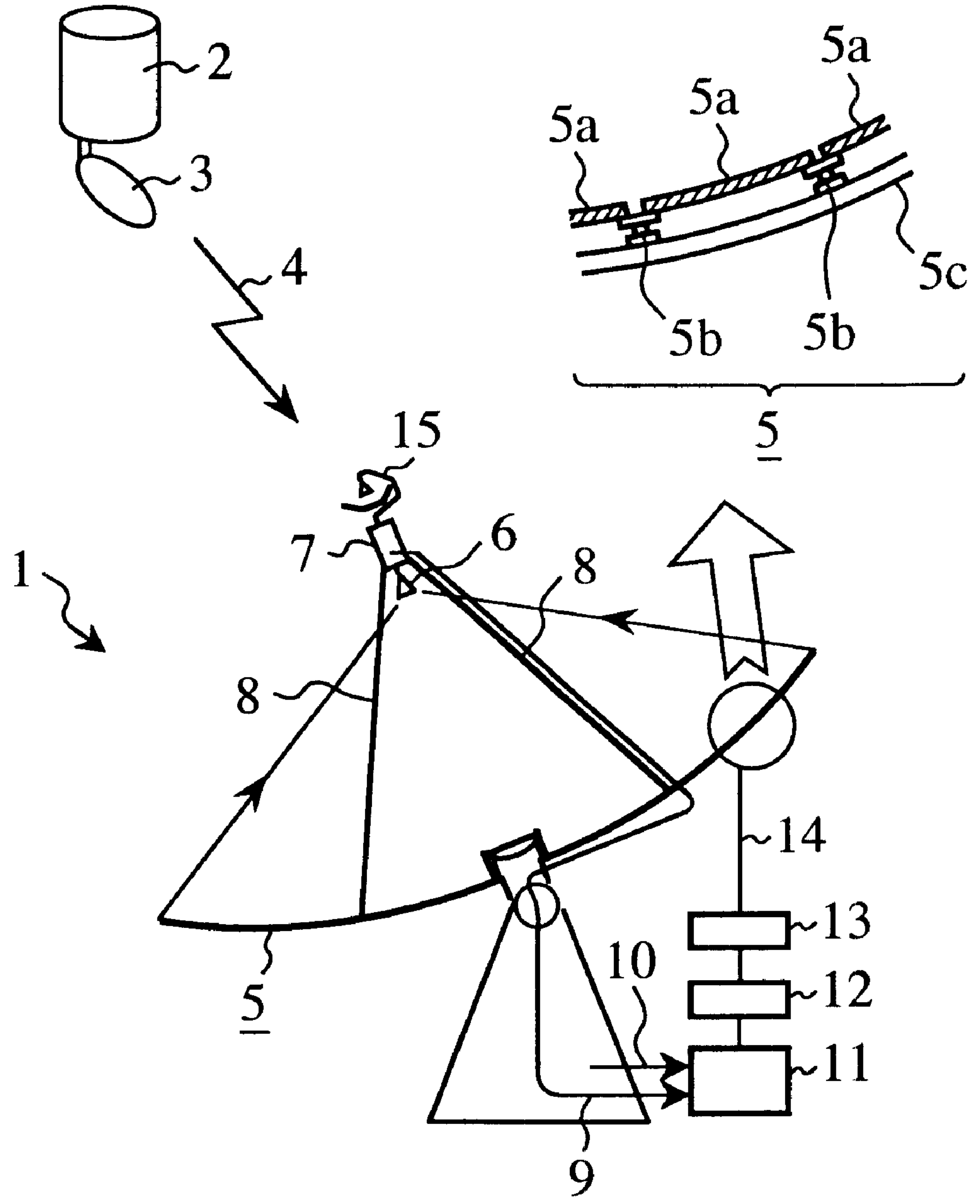
FIG.7 (PRIOR ART)
FIG. 7 is a constitutional view showing the configuration of a conventional mirror surface control system.

FIG. 1 is a mirror surface accuracy measuring device of a reflector antenna according to a first embodiment of the present invention. The constituent elements, which are the same as those shown in FIG. 7, are indicated by the same reference numerals as those of the constituent elements shown in FIG. 7.

In FIG. 1, 1 indicates a reflector antenna used for the measurement of mirror surface accuracy. 16 indicates a collimation antenna arranged at an interval of a prescribed distance from the reflector antenna 1.

4 indicates a transmitted radio wave radiated from the collimation antenna 16. 5 indicates a main reflector of which the mirror surface accuracy is measured. 5*a* indicates each of a plurality of mirror panels composing the main reflector 5. 5*b* indicates each of a plurality of actuators for changing setting positions and attitudes of the mirror panels 5*a*. 5*c* indicates a backing structure on which the mirror panels 5*a* and the actuators 5*b* are supported. 6 indicates a primary radiator in which a radio wave reflected and converged on the main reflector 5 is received. 7 indicates a receiver (or radiation field distribution measuring means) to which the transmitted radio wave 4 is fed from the primary radiator 6. 8 indicates each of a plurality of support struts. 9 indicates radiation field distribution data obtained in the receiver 7. The radiation field distribution data 9 indicates a radiation field distribution of the transmitted radio wave 4 reflected on the reflector antenna 1*a* (hereinafter, called a radiation field distribution of the reflector antenna 1). 10 indicates an antenna attitude signal. An attitude of the reflector antenna 1 is changed according to the antenna attitude signal 10 to obtain the radiation field distribution data 9 indicating the radiation field distribution of the reflector antenna 1 corresponding to various attitudes of the reflector antenna 1. 15 indicates a reference antenna in which a reference of the radiation field distribution data 9 is measured. 17 indicates a mirror panel radiation field distribution holding device in which pieces of pre-measured data (or normalized radiation fields) of each mirror panel 5*a* for a plurality of observation points are held as a panel radiation field distribution of the mirror panel 5*a*. 18 indicates a complex excitation coefficient calculating device (or complex excitation coefficient calculating means) in which a complex excitation coefficients of each mirror panel 5*a* is calculated according to the radiation field distribution data 9 and the antenna attitude signal 10 of the reflector antenna 1 and the panel radiation field distribution of the mirror panel 5*a* held in the mirror panel radiation field distribution holding device 17. 19 indicates mirror surface accuracy processor (or mirror surface accuracy calculating means) in which a degree of displacement of each mirror panel 5*a* from an ideal position is calculated according to the complex excitation coefficient of the mirror panel 5*a* obtained in the complex excitation coefficient calculating device 18 and the mirror surface accuracy of the main reflector 5 is calculated according to the degrees of displacement of the mirror panels 5*a*.

In the mirror surface accuracy measuring device of the reflector antenna 1 according to the first embodiment, each actuator 5*b* is not necessarily needed. Also, in cases where only amplitude of the radiation field distribution of the reflector antenna 1 is measured, the reference antenna 15 is not needed.

Next, a measuring principle of the mirror surface accuracy of the main reflector 5 will be described below.

In the mirror surface accuracy measuring device of the reflector antenna 1, a radiation field distribution of the reflector antenna 1 is used to measure mirror surface accuracy of the main reflector 5, and a setting position and attitude of the mirror surface of the reflector antenna 1 is adjusted by actuating the actuators 5*b* according to the mirror surface accuracy of the main reflector 5 measured by the mirror surface accuracy measuring device.

A transmitted radio wave 4 radiated from the collimation antenna 16 is reflected on all the mirror panels 5*a* composing the main reflector 5 of the reflector antenna 1, the reflected radio wave 4 is converged so as to be incident on the primary radiator 6, and the reflected radio wave 4 is received in the receiver 7. In the measurement of a radiation field distribution of the reflector antenna 1, the transmitted radio wave 4 radiated from the collimation antenna 16 is received in the receiver 7 while changing the attitude of the reflector antenna 1, and a radiation field of the transmitted radio wave 4 is measured for each attitude of the reflector antenna 1 to obtain a plurality of radiation fields as a radiation field distribution of the reflector antenna 1.

Here, because of the reversibility of the reflector antenna 1 for the direction of the propagation of the radio wave, a radiation field distribution of the reflector antenna 1 can be also obtained by reflecting a radio wave transmitted from the primary radiator 6 on the main reflector 5 of the reflector antenna 1 while changing the attitude of the reflector antenna 1 and measuring a radiation field of the reflected radio wave received in the collimator antenna 16 for each attitude of the reflector antenna 1. In other words, a radiation field distribution of the reflector antenna 1 can be also obtained by reflecting a radio wave radiated from the primary radiator 6 on the main reflector 5 and measuring a plurality of radiation fields of the reflected radio wave at a plurality of observation points placed far away from the reflector antenna 1 by the same distance.

Thereafter, radiation field distribution data 9 indicating the radiation field distribution of the reflector antenna 1 is taken out from the reflected radio wave 4 received in the receiver 7, and the radiation field distribution data 9 and an antenna attitude signal 10 of the reflector antenna 1 are sent to the complex excitation coefficient calculating device 18. The antenna attitude signal 10 indicating an attitude of the reflector antenna 1 is, for example, produced in an attitude sensor or an antenna moving unit (not shown).

In the complex excitation coefficient calculating device 18, a complex excitation coefficient of each mirror panel 5*a* is calculated according to the radiation field distribution data 9, the antenna attitude signal 10 and a panel radiation field distribution of the mirror panel 5*a* held in the mirror panel radiation field distribution holding device 17.

Figure 5A:
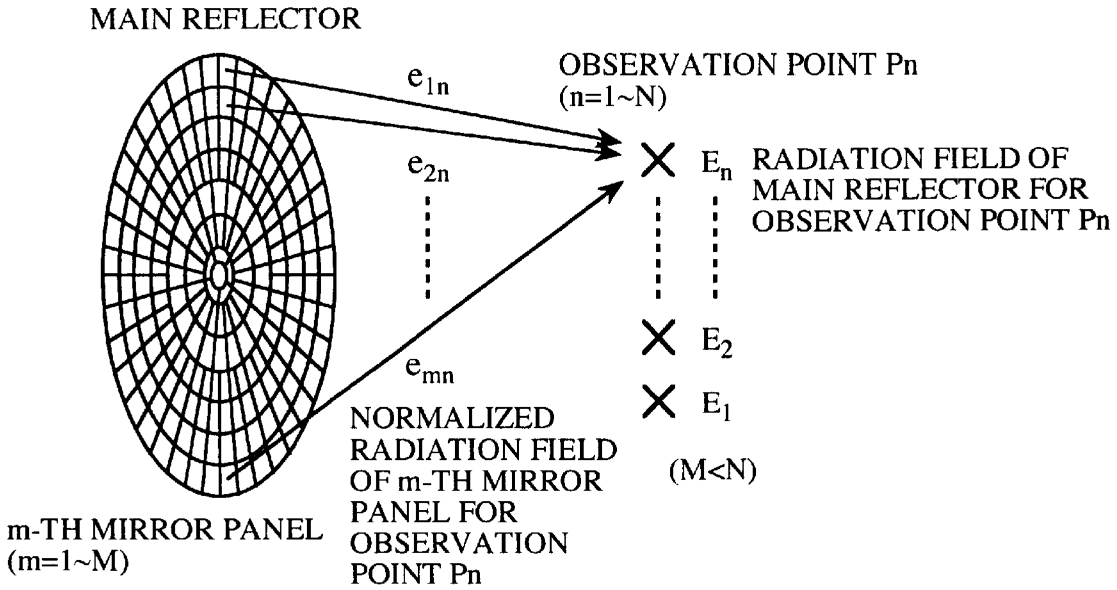
FIG. 5A is an explanatory view showing a measuring principle of the mirror surface accuracy of the reflector antenna according to the present invention.

FIG. 5A is an explanatory view showing a measuring principle of the mirror surface accuracy. In FIG. 5A, in cases where the reflector antenna 1 is set to an attitude, an observation point Pn far away from the reflector antenna 1 at an interval of a prescribed distance is placed in an arbitrary direction from the reflector antenna 1. A radiation field $E_n$ of the reflector antenna 1 for the observation point Pn is expressed according to an equation (1).

$$E_n = \sum_{m=1}^{M} a_m e_{mn} \tag{1}$$

Here, $e_{mn}$ denotes a normalized radiation field of the m-th mirror panel 5*a* of the main reflector 5, and $a_m$ denotes a complex excitation coefficient of the m-th mirror panel 5*a*. The normalized radiation fields $e_{mn}$ of each mirror panel 5*a* are measured in advance and are known. That is, the normalized radiation fields $e_{mn}$ of the mirror panels 5*a* are measured in advance as pieces of pre-measured data and are held in the mirror panel radiation field distribution holding device 17.

In cases where both the amplitude and the phase of the radiation field are measured as a measured value $F_n$ of the radiation field of the reflector antenna 1 for each observation point Pn (or for each attitude of the reflector antenna 1), the complex excitation coefficient $a_m$ of each mirror panel 5*a* is obtained by calculating a residual between the measured value $F_n$ and the radiation field $E_n$ for each observation point and minimizing a sum $\epsilon_a$ of weighted squared values of the residuals according to a least squares method. The sum $\epsilon_a$ is defined by an equation (2).

$$\varepsilon_a = \sum_{n=1}^{N} w_n |F_n - E_n|^2 \tag{2}$$

Here, $w_n$ denotes a weighting factor for the observation point Pn.

The complex excitation coefficient $a_m$ of each mirror panel 5*a* can be uniquely estimated by solving simultaneous equations expressed by a representative equation (3).

$$\frac{\partial \varepsilon_a}{\partial \mathrm{Re}[a_m]} = 0, \ \frac{\partial \varepsilon_a}{\partial \ \mathrm{Re}[a_m]} = 0 \tag{3}$$

The equation (3) represents M equations (m=1 to M).

Also, in cases where only the amplitude of the radiation field is measured as a measured value $F_n$ of the radiation field of the reflector antenna 1 for each observation point Pn, the complex excitation coefficient $a_m$ of each mirror panel 5*a* is obtained by calculating a residual between $|F_n|^2$ of the measured value and $|E_n|^2$ of the radiation field for each observation point and performing the repeated calculation using a non-linear optimizing method so as to minimize a sum $\epsilon_b$ of weighted squared values of the residuals according to the least squares method. The sum $\epsilon_b$ is defined by an equation (4).

$$\varepsilon_b = \sum_{n=1}^{N} w_n \left| |F_n|^2 - |E_n|^2 \right|^2 \tag{4}$$

Here, $w_n$ denotes a weighting factor for the observation point Pn.

Therefore, the complex excitation coefficient $a_m$ of each mirror panel 5*a* is calculated. The calculation of the complex excitation coefficients $a_m$ is performed in the complex excitation coefficient calculating device 18.

Here, in the calculation of the complex excitation coefficients $a_m$ of the mirror panels 5*a*, the amplitude of the radiation field is determined according to a blasting distribution of the primary radiator 6 to the mirror panels 5*a* in addition to the blocking of the support struts 8 of the reflector antenna 1, and the phase of the radiation field is determined in dependence on the positioning accuracy of each mirror panel 5*a*.

Figure 5B:
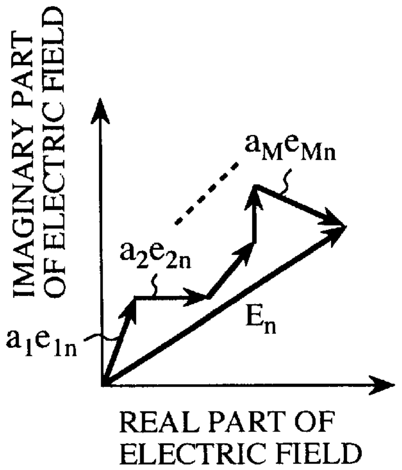
FIG. 5B shows an explanatory view showing a relationship in an equation expressing a radiation field at an observation point.
Figure 5C:
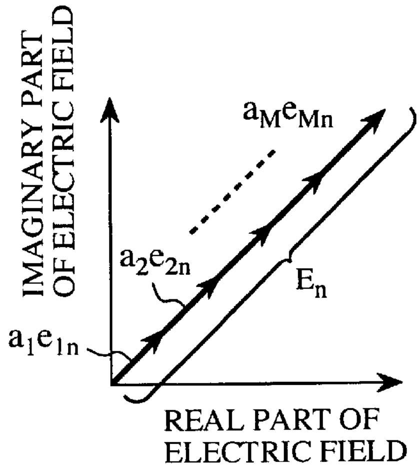
FIG. 5C shows an explanatory view showing a specific relationship in an equation expressing a radiation field at an observation point in cases where mirror panels are set at ideal positions.

The relationship in the equation (1) is shown in FIG. 5B. In cases where a gain of the reflector antenna 1 (in other words, the radiation field $E_n$ of the transmitted radio wave 4 on the reflector antenna 1) for the observation point Pn placed in the arbitrary direction from the reflector antenna 1 is maximized, as shown in FIG. 5C, it is required that a product $a_m e_{mn}$ of the complex excitation coefficient $a_m$ and the normalized radiation fields $e_{mn}$ of each mirror panel 5*a* has the same phase as those corresponding to the other mirror panels 5*a*. Therefore, in cases where the mirror panels 5*a* are placed at ideal positions, the gain of the reflector antenna 1 is maximized, and the mirror surface accuracy of the main reflector 5 is set to the best.

Figure 6:
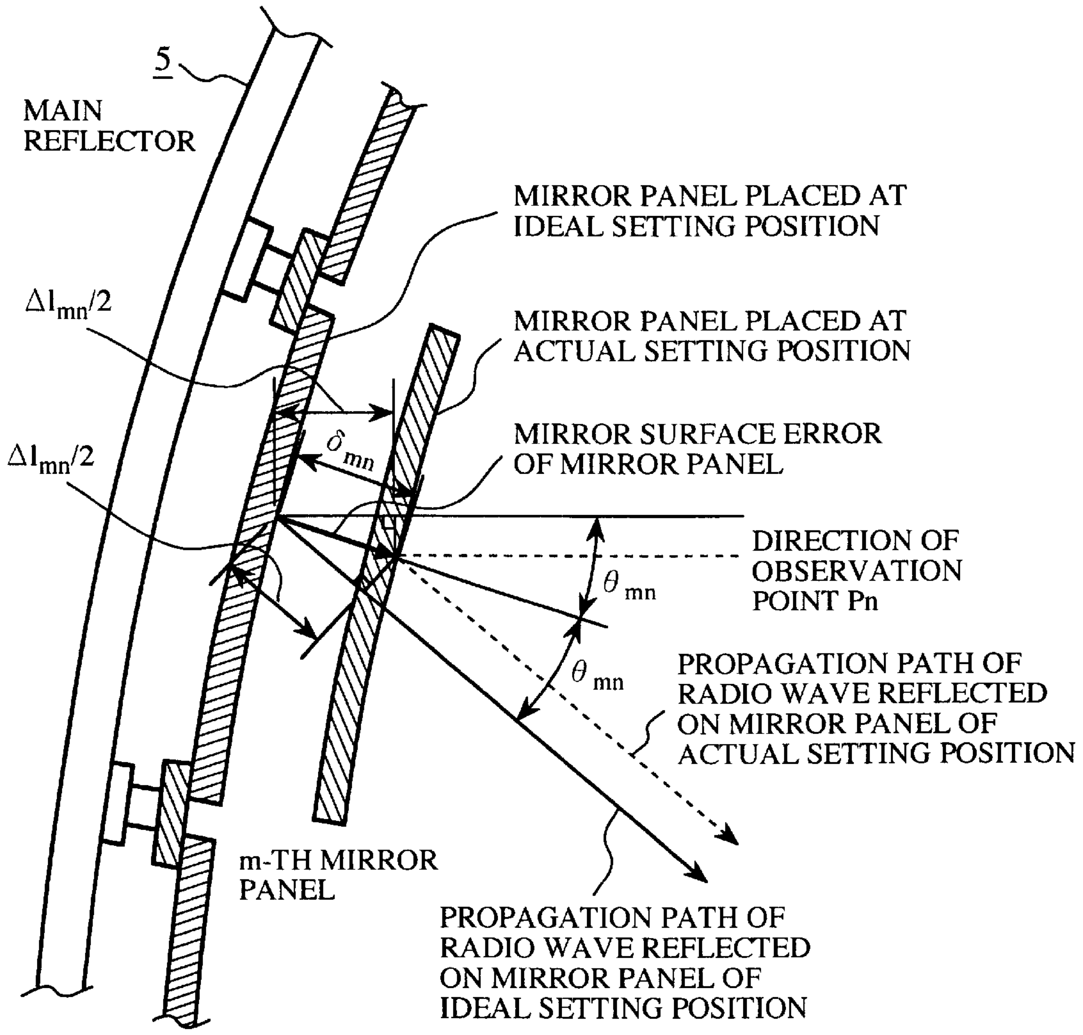
FIG. 6 shows the relationship among a mirror surface error $\delta_{mn}$ of a mirror panel, an angle $2\theta_{mn}$ between an incident radio wave and an out-going radio wave on the mirror panel and a change $\Delta l_{mn}$ of a radio wave propagation path length.

In cases where the gain of the reflector antenna 1 for the observation point Pn placed in the arbitrary direction is maximized, a mirror surface error $\delta_{mn}$ of each mirror panel 5*a* and a degree $\delta_n$ of mirror surface accuracy of the main reflector 5 are expressed according to equations (5) to (9) by using a relationship shown in FIG. 6.

$$\delta_n = \sqrt{\frac{\sum_{m=1}^{M} \delta_{mm}^2}{M-1}} \quad (5)$$

$$\delta_{mn} = \frac{\Delta l_{mn}}{\cos\theta_{mn}} \quad (6)$$

$$\Delta l_{mn} = \frac{\lambda}{2\pi}(\phi_{mn} - \bar{\phi}_n) \quad (7)$$

$$\phi_{mn} = \tan^{-1}\left(\frac{\text{Im}[a_m e_{mn}]}{\text{Re}[a_m e_{mn}]}\right)[\text{rad}] \quad (8)$$

$$\bar{\phi}_n = \frac{1}{M}\sum_{m=1}^{M} \phi_{mn}[\text{rad}] \quad (9)$$

Here, $\theta_{mn}$ in the equation (6) denotes half of an angle between an incident radio wave and an out-going radio wave on the m-th mirror panel 5*a*. $\Delta l_{mn}$ in the equation (6) denotes a change of a radio wave propagation path length caused by the mirror surface error $\delta_{mn}$ of the m-th mirror panel 5*a*. $\lambda$ in the equation (7) denotes a wavelength of the transmitted radio wave 4 corresponding to the measurement of the radiation field distribution of the reflector antenna 1 in a free space. $\phi_{mn}$ in the equation (8) denotes a phase of the radiation field $a_m e_{mn}$ including the complex excitation coefficients am at the observation point Pn. Also, a value obtained according to the equation (9) denotes an average of the phases $\phi_{mn}$ at the observation point Pn.

The mirror surface errors $\delta_{mn}$ Of the mirror panels 5*a* and the degree $\delta_n$ of the mirror surface accuracy of the main reflector 5 are calculated in the mirror surface accuracy processor 19.

As is described above, a map indicating the mirror surface errors, each of which has the resolution equivalent to a size of the corresponding mirror panel 5*a*, can be obtained, and the mirror surface accuracy of the main reflector 5 can be measured.

In the measurement of the mirror surface accuracy of the main reflector 5, because the complex excitation coefficients $a_m$ of the mirror panels 5*a* are calculated according to the least squares method, it is required that the number N of observation points for the measurement of the radiation field distribution of the reflector antenna 1 is higher than the number M of mirror panels 5*a* composing the main reflector 5. However, it is not necessarily required that the observation points are distributed in two dimensions. In other words, in the measurement of the radiation field distribution of the reflector antenna 1, it is applicable that the reflector antenna 1 be linearly moved to change the attitude of the reflector antenna 1. Therefore, though an observation area possible to significantly measure the radiation fields on the reflector antenna 1 is determined by a dynamic range of a measuring system, the mirror surface accuracy of the main reflector 5 can be measured by obtaining only a plurality of measured values of the radiation field distribution of the reflector antenna 1 for the observation points of the observation area. Accordingly, a measuring time required to obtain the measured values of the radiation field distribution of the reflector antenna 1 can be comparatively shortened, the measured values of the radiation field distribution of the reflector antenna 1 can be efficiently obtained, and influence of temperature and wind in the measurement of the radiation field distribution of the reflector antenna 1 is hardly exerted on the measured values of the radiation field distribution of the reflector antenna 1.

Also, even though only the amplitude of the radiation field distribution of the reflector antenna 1 can be measured, the mirror surface accuracy of the main reflector 5 can be measured as is described above.

Here, in cases where the reflector antenna 1 has a plurality of reflectors including the main reflector 5, the mirror surface accuracy of the reflectors including the main reflector 5 can be measured in the same manner.

As is described above, in the first embodiment, the panel radiation field distributions of the mirror panels 5*a* composing the main reflector 5 are held in the mirror panel radiation field distribution holding device 17 as the pieces of pre-measured data, the complex excitation coefficient of each mirror panel 5*a* is calculated in the complex excitation coefficient calculating device 18 according to the radiation field distribution data 9, the antenna attitude signal 10 and the panel radiation field distribution of the mirror panel 5*a* held in advance, and the mirror surface errors of the mirror panels 5*a* and the mirror surface accuracy of the main reflector 5 are calculated in the mirror surface accuracy processor 19 according to the complex excitation coefficients of the mirror panels 5*a*. Therefore, the complex excitation coefficients of the mirror panels 5*a* can be obtained to express the radiation field distribution of the reflector antenna 1 in a combination of the panel radiation field distributions of the mirror panels 5*a* composing the main reflector 5, and the mirror surface errors of the mirror panels 5*a* can be obtained. As a result, in cases where a radio wave such as a millimeter wave or a submillimeter wave of a frequency band corresponding to a very short wavelength is selected as a radio wave used for the measurement of the radiation field distribution of the reflector antenna 1, even though the observation area usable for the significant measurement of the radiation field distribution of the reflector antenna 1 is small, a map of the mirror surface errors having degrees of resolution corresponding to sizes of the mirror panels 5*a* can be obtained, and the measurement of the mirror surface accuracy of the main reflector 5 can be performed with high accuracy.

Also, the observation points can be arbitrarily selected to measure the radiation field distribution of the reflector antenna 1, and it is only required that the number of observation points for the radiation field distribution of the reflector antenna 1 is higher than the number of mirror panels 5*a* composing the main reflector 5. Accordingly, a measuring time of the mirror surface accuracy of the main reflector 5 can be comparatively shortened, and influence of temperature and wind in the measurement on the measured values can be reduce.

Also, even though only the amplitude of the radiation field distribution of the reflector antenna 1 is measured, the mirror surface accuracy of the main reflector 5 can be estimated.

Embodiment 2

Figure 2:
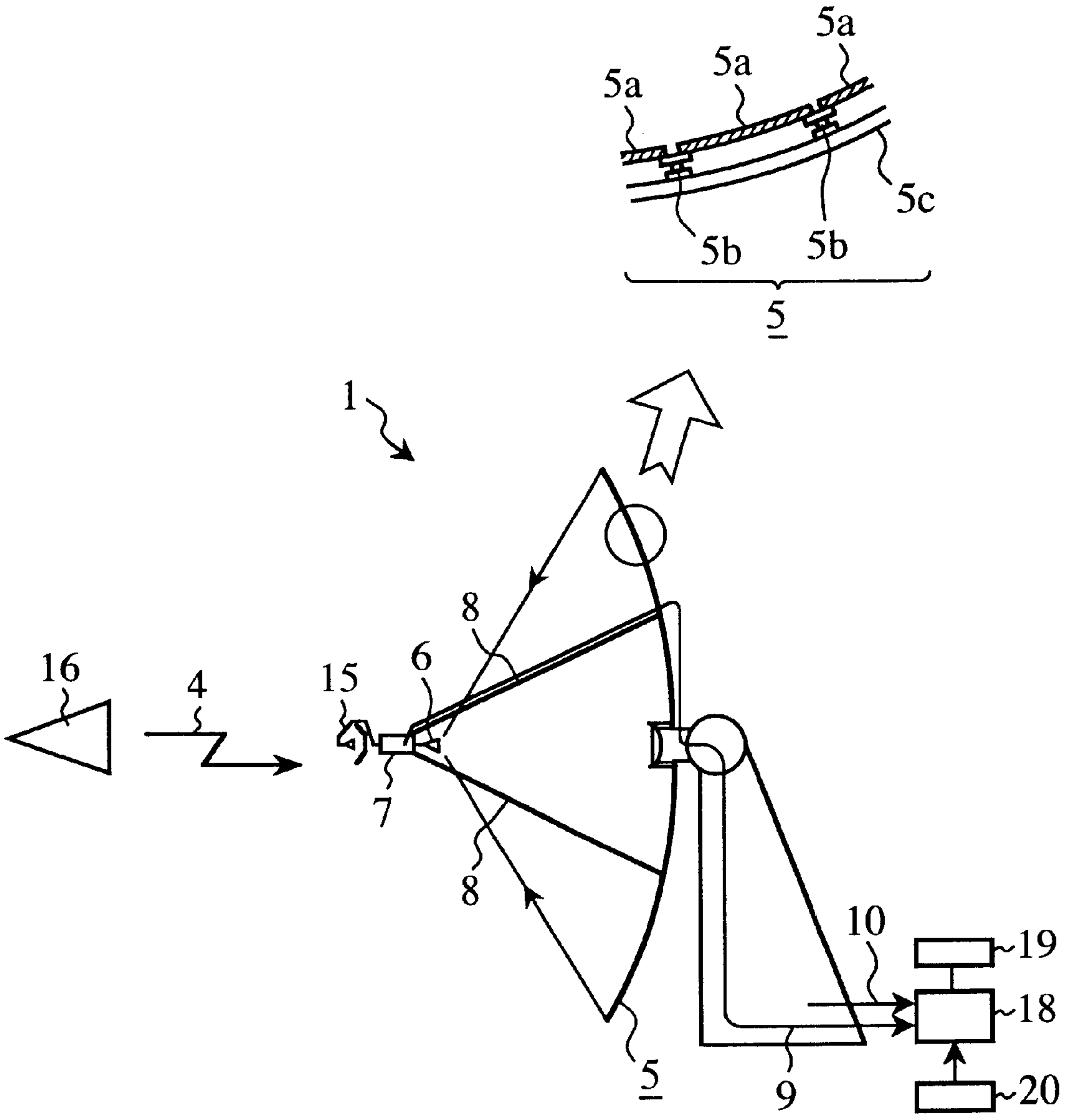
FIG. 2 is a mirror surface accuracy measuring device of a reflector antenna according to a second embodiment of the present invention.

FIG. 2 is a mirror surface accuracy measuring device of a reflector antenna according to a second embodiment of the present invention. The constituent elements, which are the same as those shown in FIG. 1, are indicated by the same reference numerals as those of the constituent elements shown in FIG. 1, and additional description of those constituent elements is omitted.

In FIG. 2, 20 indicates a virtual mirror panel radiation field distribution calculating device in which panel radiation fields of all virtual mirror panels of the main reflector 5 are calculated on condition that the main reflector 5 is divided into the virtual mirror panels.

In the first embodiment, the normalized radiation fields $e_{mn}$ of the mirror panels 5*a* are measured in advance as pieces of pre-measured data and are held in the mirror panel radiation field distribution holding device 17. However, in the second embodiment, no normalized radiation field is measured. In detail, the main reflector 5 is divided into a plurality of virtual mirror panels, panel radiation field distributions of all the virtual mirror panels of the main reflector 5 are calculated in the virtual mirror panel radiation field distribution calculating device 20. In this case, the panel radiation field distributions of all the virtual mirror panels are calculated according to a current distribution method or an aperture distribution method.

The obtained panel radiation fields of all the virtual mirror panels are used in the equation (1) as the normalized radiation fields $e_{mn}$ of the mirror panels 5*a*, and the value $F_n$ of the radiation field of the reflector antenna 1 is measured for each observation point Pn in the same manner as in the first embodiment. Therefore, in the same manner as in the first embodiment, a complex excitation coefficient of each virtual mirror panel is calculated in the complex excitation coefficient calculating device 18 according to the radiation field distribution data 9, the antenna attitude signal 10 and the panel radiation field distribution of the virtual mirror panel.

As is described above, in the measurement of the radiation field distribution of the main reflector 5 using a radio wave such as a millimeter wave or a submillimeter wave of a very short wavelength, because an area of each mirror panel 5*a* is smaller than an area of the main reflector 5, a gain of each mirror panel 5*a* actually used (in other words, a panel radiation field of each mirror panel 5*a* held in the mirror panel radiation field distribution holding device 17 as a normalized radiation field) is necessarily lowered in the first embodiment. Therefore, it is difficult in the first embodiment to significantly measure the panel radiation field distribution of each mirror panel 5*a*. However, in the second embodiment, because the panel radiation field distributions of the virtual mirror panels of the main reflector 5 calculated in the virtual mirror panel radiation field distribution calculating device 20 are used in place of the pieces of pre-measured data held in the mirror panel radiation field distribution holding device 17, it is not required to measure the panel radiation field distributions of the mirror panels 5*a* of the main reflector 5. Therefore, even though it is difficult to significantly measure the panel radiation field distribution of each mirror panel 5*a* actually used, because the panel radiation field distributions of the virtual mirror panels of the main reflector 5 are calculated, the mirror surface accuracy of the reflector antenna 1 can be reliably measured.

Also, in the second embodiment, because the number of measuring operations actually performed is reduced, an overall time required to measure the mirror surface accuracy of the reflector antenna 1 can be shortened as compared with that in the first embodiment.

Also, in the second embodiment, because the sizes of the virtual mirror panels can be arbitrary set, the sizes of the virtual mirror panels can be set so as to be smaller than those of the mirror panels 5*a*. Accordingly, a map of a plurality of mirror surface errors of the virtual mirror panels having resolution higher than that in the first embodiment can be obtained.

Also, in the second embodiment, because the panel radiation field distributions of the virtual mirror panels of the main reflector 5 are used in place of the panel radiation field distributions of the mirror panels 5*a* of the main reflector 5, even though the main reflector 5 is formed of only one mirror panel, the mirror surface accuracy of the reflector antenna 1 can be measured. Therefore, it is not necessarily required that the main reflector 5 is divided into the plurality of mirror panels 5*a*, and the restriction for the reflector antenna 1 can be reduced.

Embodiment 3

Figure 3:
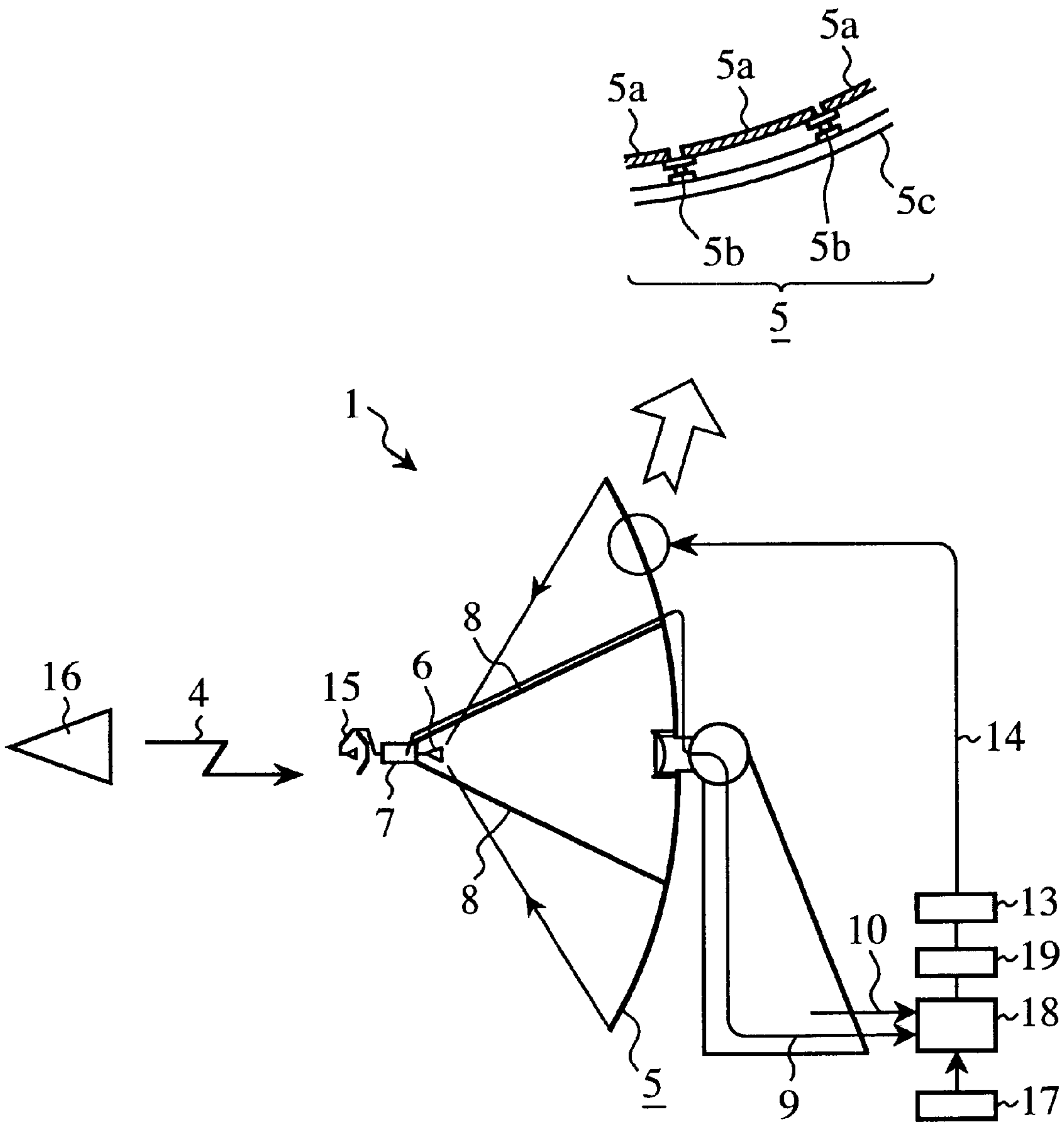
FIG. 3 is a mirror surface control system of a reflector antenna according to a third embodiment of the present invention.

FIG. 3 is a mirror surface control system of a reflector antenna according to a third embodiment of the present invention. The constituent elements, which are the same as those shown in FIG. 1, are indicated by the same reference numerals as those of the constituent elements shown in FIG. 1, and additional description of those constituent elements is omitted.

In FIG. 3, 13 indicates a mirror surface control device (or mirror surface control means) which controls an operation of the actuators 5*b* so as to make the actuators 5*b* adjust a plurality of setting positions of the mirror panels 5*a* of the main reflector 5 according to the mirror surface errors $\delta_{mn}$ of the mirror panels 5*a* obtained in the mirror surface accuracy processor 19. 14 indicates each of a plurality of actuator control signals produced in the mirror surface control device 13 according to the mirror surface errors $\delta_{mn}$ of the mirror panels 5*a*.

Next, an operation of the mirror surface control system will be described below.

The mirror surface errors $\delta_{mn}$ of the mirror panels 5*a* and the degree $\delta_n$ of the mirror surface accuracy of the main reflector 5 are calculated in the mirror surface accuracy processor 19 in the same manner as in the first embodiment.

The mirror surface errors $\delta_{mn}$ of the mirror panels 5*a* calculated in the mirror surface accuracy processor 19 are input to the mirror surface control device 13, and a plurality of actuator control signals 14 are produced in the mirror surface control device 13 according to the mirror surface errors $\delta_{mn}$ Of the mirror panels 5*a*. Each actuator control signal 14 corresponds to one actuator 5*b*, and the actuator control signals 14 are set to values corresponding to the mirror surface errors $\delta_{mn}$ of the mirror panels 5*a*. Therefore, each actuator 5*b* is actuated according to the corresponding actuator control signal 14, and a plurality of setting positions of the mirror panels 5*a* are corrected by the actuators 5*b*. Accordingly, the mirror surface accuracy of the main reflector 5 can be improved, and the main reflector 5 can be set with high mirror surface accuracy.

As is described above, in the third embodiment, the mirror surface control device 13 controls the actuators 5*b* according to the mirror surface errors $\delta_{mn}$ of the mirror panels 5*a* obtained in the mirror surface accuracy processor 19 to make the actuators 5*b* correct a plurality of setting positions of the mirror panels 5*a*. Therefore, in cases where the complex excitation coefficients of the mirror panels 5*a* are obtained to express the radiation field distribution of the reflector antenna 1 in a combination of the panel radiation field distributions of the mirror panels 5*a* composing the main reflector S and to obtain a map of the mirror surface errors having degrees of resolution corresponding to sizes of the mirror panels 5*a*, the setting positions of the mirror panels 5*a* can be adjusted. Accordingly, in addition to the effects obtained in the first embodiment, the main reflector 5 can be set with high mirror surface accuracy.

Embodiment 4

Figure 4:
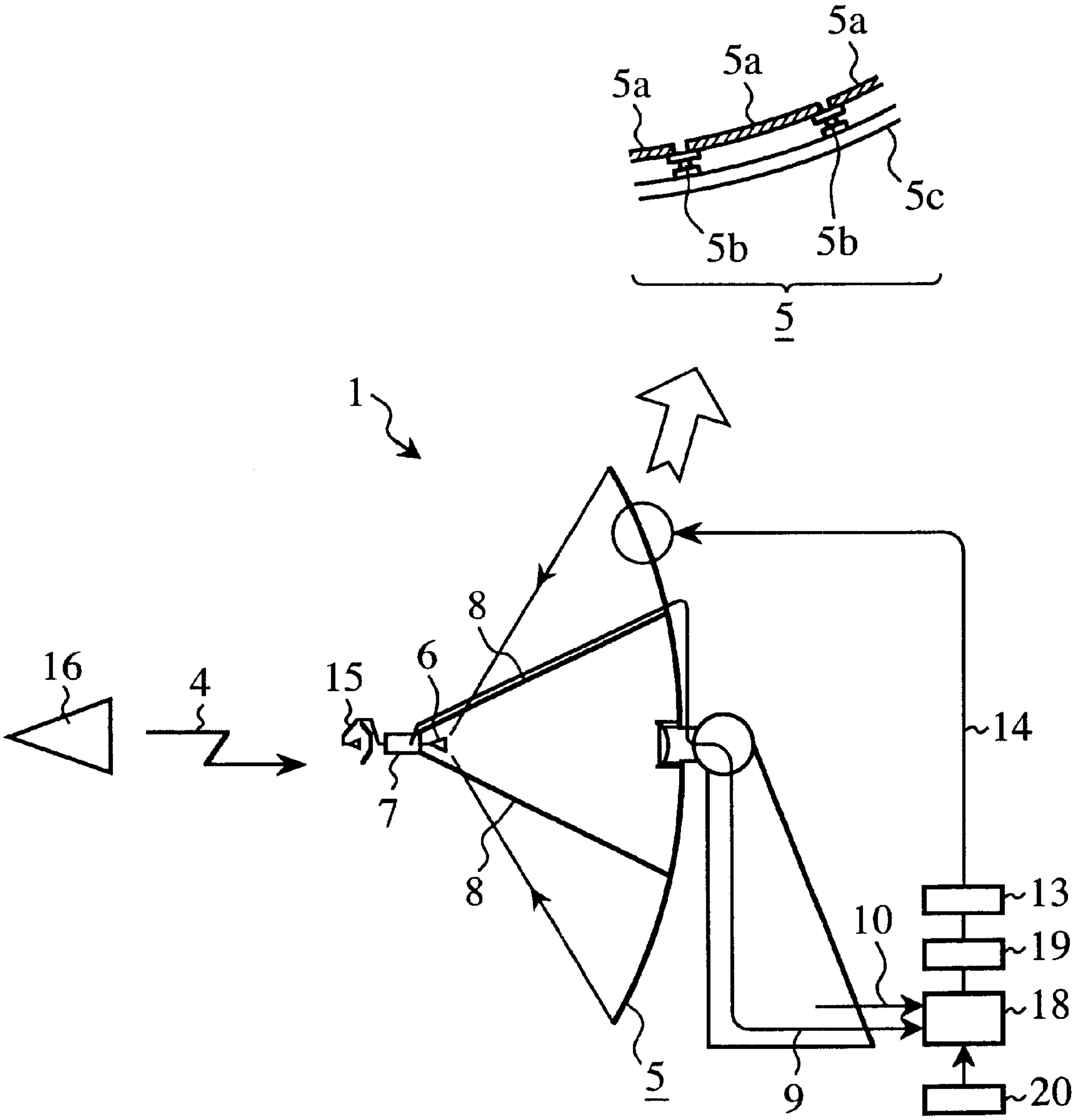
FIG. 4 is a mirror surface control system of a reflector antenna according to a fourth embodiment of the present invention.

FIG. 4 is a mirror surface control system of a reflector antenna according to a fourth embodiment of the present invention. The constituent elements, which are the same as those shown in FIG. 2, are indicated by the same reference numerals as those of the constituent elements shown in FIG. 2, and additional description of those constituent elements is omitted.

In FIG. 4, 13 indicates a mirror surface control device (or mirror surface control means) which controls an operation of the actuators 5*b* so as to make the actuators 5*b* adjust a plurality of setting positions of the mirror panels 5*a* of the main reflector 5 according to the mirror surface errors of the virtual mirror panels obtained in the mirror surface accuracy processor 19. 14 indicates each of a plurality of actuator control signals produced in the mirror surface control device 13 according to the mirror surface errors of the virtual mirror panels.

Next, an operation of the mirror surface control system will be described below.

The mirror surface errors of the virtual mirror panels and the mirror surface accuracy $\delta_n$ of the main reflector 5 are calculated in the mirror surface accuracy processor 19 in the same manner as in the second embodiment.

The mirror surface errors of the virtual mirror panels calculated in the mirror surface accuracy processor 19 are input to the mirror surface control device 13, and a plurality of actuator control signals 14 are produced in the mirror surface control device 13 according to the mirror surface errors of the virtual mirror panels. Each actuator control signal 14 corresponds to one actuator 5*b*, and the actuator control signals 14 are set to values corresponding to the mirror surface errors of the virtual mirror panels. Therefore, each actuator 5*b* is actuated according to the corresponding actuator control signal 14, and a plurality of setting positions of the mirror panels 5*a* are corrected by the actuators 5*b*. Accordingly, the mirror surface accuracy of the main reflector 5 can be improved, and the main reflector 5 can be set with high mirror surface accuracy.

As is described above, in the fourth embodiment, the mirror surface control device 13 controls the actuators 5*b* according to the mirror surface errors of the virtual mirror panels obtained in the mirror surface accuracy processor 19 to make the actuators 5*b* correct a plurality of setting positions of the mirror panels 5*a*. Therefore, in cases where the complex excitation coefficients of the virtual mirror panels are obtained to express the radiation field distribution of the reflector antenna 1 in a combination of the panel radiation field distributions of the virtual mirror panels composing the main reflector 5 and to obtain a map of the mirror surface errors having degrees of resolution corresponding to sizes of the virtual mirror panels, the setting positions of the mirror panels 5*a* can be adjusted. Accordingly, in addition to the effects obtained in the second embodiment, the main reflector 5 can be set with high mirror surface accuracy.

What is claimed is:

1. A mirror surface accuracy measuring device of a reflector antenna, in which mirror surface accuracy of a reflector antenna having a main reflector including a plurality of mirror panels is measured, comprising:

a collimation antenna arranged at an interval of a prescribed distance from the reflector antenna;

radiation field distribution measuring means for measuring a radiation field distribution of the reflector antenna for the prescribed distance of the collimation antenna while controlling an attitude of the reflector antenna;

a mirror panel radiation field distribution holding device for holding a panel radiation field distribution of each mirror panel of the main reflector as pre-measured data;

complex excitation coefficient calculating means for calculating a complex excitation coefficient of each mirror panel of the main reflector according to the radiation field distribution of the reflector antenna measured by the radiation field distribution measuring means, the panel radiation field distribution of the mirror panel held in the mirror panel radiation field distribution holding device and an antenna attitude signal which indicates the attitude of the reflector antenna controlled by the radiation field distribution measuring means; and mirror surface accuracy calculating means for calculating a mirror surface error of each mirror panel and mirror surface accuracy of the main reflector according to the complex excitation coefficients of the mirror panels of the main reflector calculated by the complex excitation coefficient calculating means.

2. A mirror surface accuracy measuring device of a reflector antenna according to claim 1, wherein the radiation field distribution of the reflector antenna is obtained by the radiation field distribution measuring means by measuring a radiation field of a radio wave, which is transmitted between the collimation antenna and the radiation field distribution measuring means and is reflected on the main reflector, for each attitude of the reflector antenna.

3. A mirror surface accuracy measuring device of a reflector antenna according to claim 2, wherein the reflector antenna is linearly moved to change the attitude of the reflector antenna.

4. A mirror surface accuracy measuring device of a reflector antenna, in which mirror surface accuracy of a reflector antenna having a main reflector including a plurality of mirror panels is measured, comprising:

a collimation antenna arranged at an interval of a prescribed distance from the reflector antenna;

radiation field distribution measuring means for measuring a radiation field distribution of the reflector antenna for the prescribed distance of the collimation antenna while controlling an attitude of the reflector antenna;

a virtual mirror panel radiation field distribution calculating device for dividing the main reflector into a plurality of virtual mirror panels and calculating a panel radiation field distribution of each virtual mirror panel;

complex excitation coefficient calculating means for calculating a complex excitation coefficient of each virtual mirror panel of the main reflector according to the radiation field distribution of the reflector antenna measured by the radiation field distribution measuring means, the panel radiation field distribution of the virtual mirror panel calculated in the virtual mirror panel radiation field distribution calculating device and an antenna attitude signal which indicates the attitude of the reflector antenna controlled by the radiation field distribution measuring means; and mirror surface accuracy calculating means for calculating a mirror surface error of each virtual mirror panel and mirror surface accuracy of the main reflector according to the complex excitation coefficients of the virtual mirror panels of the main reflector calculated by the complex excitation coefficient calculating means.

5. A mirror surface accuracy measuring device of a reflector antenna according to claim 4, wherein the radiation field distribution of the reflector antenna is obtained by the radiation field distribution measuring means by measuring a radiation field of a radio wave, which is transmitted between the collimation antenna and the radiation field distribution measuring means and is reflected on the main reflector, for each attitude of the reflector antenna.

6. A mirror surface accuracy measuring device of a reflector antenna according to claim 5, wherein the reflector antenna is linearly moved to change the attitude of the reflector antenna.

7. A mirror surface control system of a reflector antenna, in which mirror surface accuracy of a reflector antenna having a main reflector including a plurality of mirror panels is controlled, comprising:

a collimation antenna arranged at an interval of a prescribed distance from the reflector antenna;

radiation field distribution measuring means for measuring a radiation field distribution of the reflector antenna for the prescribed distance of the collimation antenna while controlling an attitude of the reflector antenna;

a mirror panel radiation field distribution holding device for holding a panel radiation field distribution of each mirror panel of the main reflector as pre-measured data;

complex excitation coefficient calculating means for calculating a complex excitation coefficient of each mirror panel of the main reflector according to the radiation field distribution of the reflector antenna measured by the radiation field distribution measuring means, the panel radiation field distribution of the mirror panel held in the mirror panel radiation field distribution holding device and an antenna attitude signal which indicates the attitude of the reflector antenna controlled by the radiation field distribution measuring means;

mirror surface accuracy calculating means for calculating a mirror surface error of each mirror panel and mirror surface accuracy of the main reflector according to the complex excitation coefficients of the mirror panels of the main reflector calculated by the complex excitation coefficient calculating means; and mirror surface control means for controlling and correcting a plurality of setting positions of the mirror panels of the main reflector according to the mirror surface errors of the mirror panels.

8. A mirror surface control system of a reflector antenna according to claim 7, wherein the radiation field distribution of the reflector antenna is obtained by the radiation field distribution measuring means by measuring a radiation field of a radio wave, which is transmitted between the collimation antenna and the radiation field distribution measuring means and is reflected on the main reflector, for each attitude of the reflector antenna.

9. A mirror surface control system of a reflector antenna according to claim 8, wherein the reflector antenna is linearly moved to change the attitude of the reflector antenna.

10. A mirror surface control system of a reflector antenna, in which mirror surface accuracy of a reflector antenna having a main reflector including a plurality of mirror panels is controlled, comprising:

a collimation antenna arranged at an interval of a prescribed distance from the reflector antenna;

radiation field distribution measuring means for measuring a radiation field distribution of the reflector antenna for the prescribed distance of the collimation antenna while controlling an attitude of the reflector antenna;

a virtual mirror panel radiation field distribution calculating device for dividing the main reflector into a plurality of virtual mirror panels and calculating a panel field distribution of each virtual mirror panel;

complex excitation coefficient calculating means for calculating a complex excitation coefficient of each virtual mirror panel of the main reflector according to the radiation field distribution of the reflector antenna measured by the radiation field distribution measuring means, the panel radiation field distribution of the virtual mirror panel calculated in the virtual mirror panel radiation field distribution calculating device and an antenna attitude signal which indicates the attitude of the reflector antenna controlled by the radiation field distribution measuring means;

mirror surface accuracy calculating means for calculating a mirror surface error of each virtual mirror panel and mirror surface accuracy of the main reflector according to the complex excitation coefficients of the virtual mirror panels of the main reflector calculated by the complex excitation coefficient calculating means; and mirror surface control means for controlling and correcting a plurality of setting positions of the mirror panels of the main reflector according to the mirror surface errors of the virtual mirror panels.

11. A mirror surface control system of a reflector antenna according to claim 10, wherein the radiation field distribution of the reflector antenna is obtained by the radiation field distribution measuring means by measuring a radiation field of a radio wave, which is transmitted between the collimation antenna and the radiation field distribution measuring means and is reflected on the main reflector, for each attitude of the reflector antenna.

12. A mirror surface control system of a reflector antenna according to claim 11, wherein the reflector antenna is linearly moved to change the attitude of the reflector antenna.

* * * * *